(12) United States Patent
Shibib et al.

(10) Patent No.: US 7,087,959 B2
(45) Date of Patent: Aug. 8, 2006

(54) METAL-OXIDE-SEMICONDUCTOR DEVICE HAVING AN ENHANCED SHIELDING STRUCTURE

(75) Inventors: Muhammed Ayman Shibib, Wyomissing, PA (US); Shuming Xu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/920,656

(22) Filed: Aug. 18, 2004

(65) Prior Publication Data
US 2006/0038224 A1 Feb. 23, 2006

(51) Int. Cl.
*H01L 29/94* (2006.01)

(52) U.S. Cl. .................. 257/335; 257/337; 438/348

(58) Field of Classification Search ............. 257/508, 257/335, 337–342; 438/348, 361
See application file for complete search history.

(56) References Cited

U.S. PATENT DOCUMENTS

| | | | | |
|---|---|---|---|---|
| 4,939,567 | A * | 7/1990 | Kenney | 257/383 |
| 5,859,466 | A * | 1/1999 | Wada | 257/508 |
| 6,445,019 | B1 * | 9/2002 | Van Dalen | 257/217 |
| 2005/0082610 | A1 * | 4/2005 | Shibib et al. | 257/335 |

OTHER PUBLICATIONS

B. Bakeroot et al., "Using 'Adaptive Resurf' Technique and Field Plate Working to Improve the Safe Operating Area of n-type Drain Extended MOS Transistors," *Modeling and Simulation of Microsystems*, pp. 498-501, 2001.
S-C. Lee et al., "A New Vertical Channel LDMOS," *Physica Scripta T101*, pp. 58-60, 2002.

* cited by examiner

Primary Examiner—Douglas W. Owens

(57) ABSTRACT

An MOS device includes a semiconductor layer formed on a substrate, the substrate defining a horizontal plane and a vertical direction normal to the horizontal plane. First and second source/drain regions are formed in the semiconductor layer proximate an upper surface of the semiconductor layer, the first and second source/drain regions being spaced apart relative to one another. A gate is formed proximate the upper surface of the semiconductor layer and disposed at least partially between the first and second source/drain regions. A first dielectric region is formed in the MOS device, the first dielectric region defining a trench extending downward from the upper surface of the semiconductor layer to a first distance into the semiconductor layer, the first dielectric region being formed between the first and second source/drain regions. The MOS device further includes a shielding structure formed primarily in the first dielectric region, at least a portion of the shielding structure being disposed adjacent a bottom wall of the first dielectric region and/or one or more sidewalls of the first dielectric region.

21 Claims, 5 Drawing Sheets

METAL-OXIDE-SEMICONDUCTOR DEVICE HAVING AN ENHANCED SHIELDING STRUCTURE

FIELD OF THE INVENTION

The present invention relates generally to semiconductor devices, and more particularly relates to a diffusion metal-oxide-semiconductor (DMOS) device including an improved shielding structure.

BACKGROUND OF THE INVENTION

Power metal-oxide-semiconductor (MOS) devices, including lateral DMOS devices and vertical DMOS devices, are employed in a variety of applications, such as, for example, power amplifiers in wireless communications systems. Conventional lateral DMOS devices typically exhibit undesirable hot carrier induced (HCI) degradation due at least in part to ionized carriers that become trapped at an upper surface interface between the silicon and oxide of the device. Additionally, lateral DMOS devices generally exhibit relatively low breakdown voltages, compared to vertical DMOS devices, due at least in part to a higher electric field concentration at or near the upper surface of the device. Vertical DMOS devices, on the other hand, typically exhibit reduced gain, due at least in part to a relatively high resistance source contact, and increased reverse transfer capacitance (Crss), which can significantly affect high-frequency (e.g., above 1 gigahertz (GHz)) performance of the device. Consequently, the electrical performance of a vertical DMOS is generally unacceptable, particularly for high-frequency applications.

In many applications, such as, for example, power applications and applications in which high-frequency operation is desired, it is advantageous to minimize the on-resistance associated with the MOS device. In a lateral DMOS device, reduced on-resistance is typically achieved by increasing a doping concentration in a lightly doped drain (LDD) region of the device. However, since the LDD region is typically formed proximate the silicon/oxide interface of the device, increasing the doping concentration of the LDD region also undesirably increases HCI degradation in the device, thereby significantly impacting device reliability.

There exists a need, therefore, for an MOS device capable of improved performance and reliability that does not suffer from one or more of the above-noted deficiencies typically affecting conventional MOS devices. Furthermore, it would be desirable if such an MOS device was fully compatible with standard CMOS process technology.

SUMMARY OF THE INVENTION

The present invention provides techniques for reducing the on-resistance of an MOS device without significantly increasing HCI degradation and/or the gate-to-drain capacitance in the device, thereby improving high-frequency performance and reliability of the device. Moreover, the techniques of the present invention can be used to fabricate an integrated circuit (IC) device, for example, a DMOS device, using conventional CMOS-compatible process technology. Consequently, the cost of manufacturing the IC device is not significantly increased.

In accordance with one aspect of the invention, an MOS devices includes a semiconductor layer formed on a substrate, the substrate defining a horizontal plane and a vertical direction normal to the horizontal plane. First and second source/drain regions are formed in the semiconductor layer proximate an upper surface of the semiconductor layer, the first and second source/drain regions being spaced apart relative to one another. A gate is formed proximate the upper surface of the semiconductor layer and disposed at least partially between the first and second source/drain regions. A first dielectric region is formed in the MOS device, the first dielectric region defining a trench extending downward from the upper surface of the semiconductor layer to a first distance into the semiconductor layer, the first dielectric region being formed between the first and second source/drain regions. The MOS device further includes a shielding structure formed primarily in the first dielectric region, at least a portion of the shielding structure being disposed adjacent a bottom wall of the first dielectric region and/or one or more sidewalls of the first dielectric region. In this manner, the MOS device exhibits improved electrical performance (e.g., reduced on-resistance) and/or reliability (e.g., reduced HCI degradation, increased breakdown voltage, etc.), and is substantially compatible with standard CMOS process technology.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative CMOS semiconductor fabrication technology suitable for forming DMOS transistors, as well as other devices and/or circuits. It should be appreciated, however, that the present invention is not limited to the fabrication of this or any particular device or circuit. Rather, the invention is more generally applicable to an MOS device comprising a novel shielding structure which advantageously improves electrical performance (e.g., reduced on-resistance) and/or reliability (e.g., increased breakdown voltage) of the device without significantly increasing HCI degradation effects and/or gate-to-drain capacitance in the device.

Although implementations of the present invention are described herein in the context of an N-channel MOS device, it is well understood by those skilled in the art that a P-channel MOS device could be formed by simply substituting opposite polarities to those given for the N-channel embodiment, and that the techniques and advantages of the present invention will similarly apply to the alternative embodiment. Furthermore, it is to be understood that the various layers and/or regions shown in the accompanying figures may not be drawn to scale, and that one or more semiconductor layers and/or regions of a type commonly used in such integrated circuit structures may not be explicitly shown in a given figure for ease of explanation. This does not imply that the semiconductor layer(s) and/or region(s) not explicitly shown are omitted in the actual integrated circuit structure.

Figure 1:
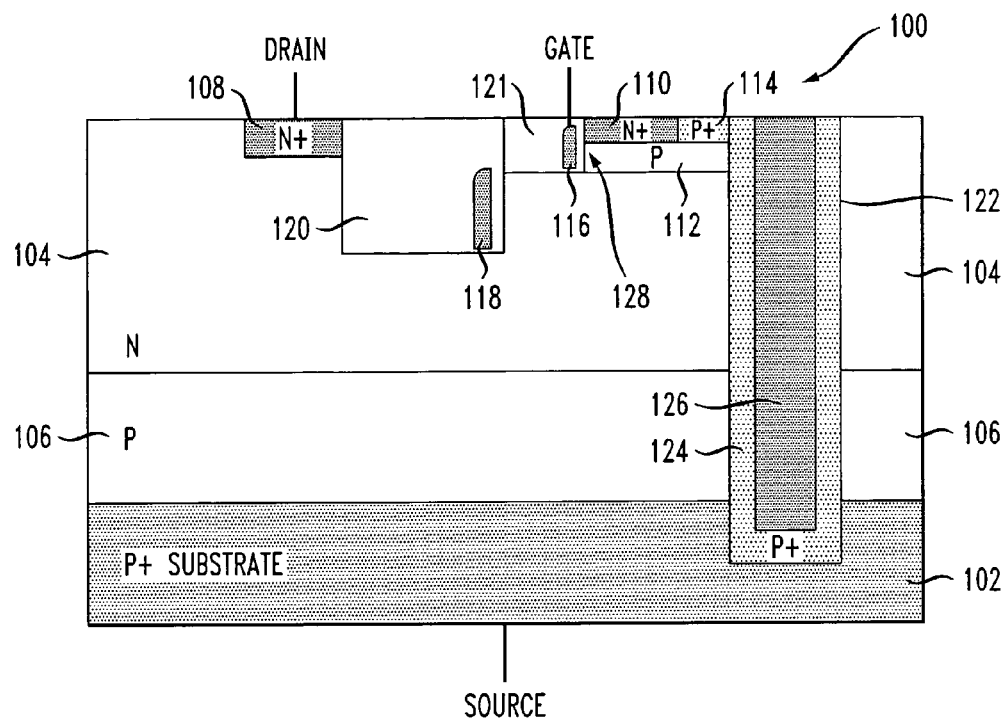
FIG. 1 is a cross-sectional view illustrating at least a portion of an exemplary DMOS device, formed in accordance with an illustrative embodiment of the present invention.

FIG. 1 illustrates a cross-sectional view of at least a portion of a semiconductor wafer in which the techniques of the present invention are implemented. The wafer includes an exemplary DMOS device 100 formed on a semiconductor substrate 102. The substrate 102 is commonly formed of single-crystal silicon, although alternative materials may be used, such as, but not limited to, germanium (Ge), gallium arsenide (GaAs), etc. Additionally, the substrate 102 may have been modified by adding an impurity or dopant, such as by a diffusion or implant step, to change the conductivity of the material (e.g., N-type or P-type). In a preferred embodiment of the invention, the substrate 102 is of P-type conductivity that is heavily doped, often represented with a "+" designation, and hence may be referred to as a P+ substrate.

The term "semiconductor layer" as may be used herein refers to any semiconductor material upon which and/or in which other materials may be formed. The semiconductor layer may be formed on the substrate 102 and may comprise a single layer, such as, for example, an epitaxial layer 104, or it may comprise multiple layers, such as, for example, a charge-balancing layer 106 and the epitaxial layer formed on the charge-balancing layer. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on or in which a circuit element may be formed.

The epitaxial layer 104 is preferably doped with an N-type impurity (e.g., phosphorus, arsenic, etc.) of a known concentration level, such as, for example, about $10^{15}$ to about $10^{17}$ atoms per cubic centimeter, to selectively change the conductivity of the material as desired. The epitaxial layer 104 generally has substantially uniform doping, which is advantageous for avoiding abrupt gradations in doping level that can result in an increased peak electric field in certain regions of the device. Alternatively, layer 104 can be formed as an N-type diffused layer using, for example, a conventional diffusion process. Charge-balancing layer 106 is preferably lightly doped with a P-type impurity (e.g., boron) having a doping concentration of about $10^{14}$ to about $3 \times 10^{15}$ atoms per cubic centimeter, although the invention is not limited to any particular doping concentration. Consequently, layer 106 may be referred to herein as a P-layer. P-layer 106, if used, serves to balance at least a portion of the charge in the epitaxial layer 104.

The exemplary DMOS device 100 further includes a source region 110 and a drain region 108 formed in the epitaxial layer 104, such as by an implant or diffusion process. The source and drain regions are preferably doped, such as by an implant process, with an impurity (e.g., boron, phosphorus, etc.) of a known concentration level to selectively change the conductivity of the material as desired. Preferably, the source and drain regions 110, 108 have a conductivity type associated therewith which is opposite a conductivity type of the substrate 102, so that active regions can be formed in the device. In a preferred embodiment of the invention, the source and drain regions 110, 108 are of N-type conductivity. It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region.

A low-resistance (e.g., less than about 10 ohms per square) electrical path between the source region 110 and the substrate 102 may be provided, such as, for example, by forming one or more trench sinkers 122 through the epitaxial layer 104 and P-layer 106, and at least partially through the substrate 102. The trench sinker 122 may be formed in a conventional manner, such as, for example, by forming one or more openings in the epitaxial layer 104 (e.g., by photolithographic patterning and etching) to expose the substrate 102, and forming an electrically conductive material 124 (e.g., doped polysilicon) on at least one or more sidewalls and/or a bottom wall of the opening, such as by using a trench fill process, as will be understood by those skilled in the art. In a preferred embodiment of the invention, the conductive material 124 is of P-type conductivity. A center portion 126 of the trench sinker 122 also preferably comprises a conductive material (e.g., doped polysilicon, metal, etc.), although a nonconductive material (e.g., silicon dioxide) may also be used which, in this case, may serve to add structural rigidity to the trench sinker 122. Alternatively, the trench sinker 122 may comprise a diffused sinker, which may be formed in a conventional manner, for example, by doping the upper surface of the wafer 100 with a heavy impurity predeposition (e.g., boron) or implanting a very high dose ion implant, which is then driven at a high temperature down to the substrate 102.

The source region 110 in the exemplary DMOS device 100 is preferably formed in a body region 112 formed in the epitaxial layer 104. The body region 112 is preferably formed proximate an upper surface of the epitaxial layer 104 and may extend laterally beyond the source region 110. The body region 112 is preferably doped, such as by a conventional implant step, with an impurity of a known concentration level to selectively change the conductivity of the material as desired. Preferably, the body region 112 has a conductivity type associated therewith which is opposite a conductivity type of the source region 110. In a preferred embodiment of the invention, the body region 112 is of P-type conductivity, and may therefore be referred to as a P-body region.

The exemplary DMOS device 100 includes a first dielectric region 120 and a second dielectric region 121, each of the dielectric regions defining a trench extending downward from the upper surface of the epitaxial layer 104 a certain distance into the epitaxial layer. The first dielectric region 120 extends a first distance into the epitaxial layer 104 and the second dielectric region 121 extends a second distance into the epitaxial layer, the first distance being greater than the second distance. Although at least a sidewall of the second dielectric region 121 nearest the source region 110 is preferably substantially orthogonal to a plane of the substrate 102, as shown, a shape of the second dielectric region is not limited to that shown in the figure. For instance, one or more sidewalls of the second dielectric region 121 may be v-shaped. The second dielectric region 121, which may comprise an oxide (e.g., silicon dioxide) or other suitable insulating material (e.g., silicon nitride, etc.), is preferably formed between the source and drain regions 110, 108.

DMOS device 100 further includes a gate 116 formed proximate the upper surface of the epitaxial layer 104 and at least partially between the drain and source regions 108, 110. In the illustrative embodiment shown in FIG. 1, the gate 116 is disposed substantially vertically in the second dielectric region 121, although alternative arrangements for the gate are contemplated by the invention, some of which will be described in further detail below. The gate 116 is preferably formed adjacent at least a portion of a sidewall and/or a bottom wall of the second dielectric region 121, proximate the source region 110 and the P-body region 112. Gate 116 may be formed on an oxide layer that formed on the sidewalls and/or bottom wall of the second dielectric region 121, such as by using an oxidation process. The oxide layer, which may be referred to as gate oxide, electrically isolates the gate 116 from at least the surrounding epitaxial layer 104.

The gate 116 is preferably formed of an electrically conductive material, such as, for example, polysilicon material, although suitable alternative materials (e.g., metal, etc.) may be similarly employed. A resistance of the gate 116 may be reduced by applying a silicide layer (not shown) to the gate, which may be particularly beneficial for use in certain high-frequency applications. Depending on whether the gate 116 is formed on a sidewall or the bottom of the second dielectric region 121, a maximum width of the gate 116 will be determined by a depth or width, respectively, of the first dielectric region, as will become apparent to those skilled in the art. The second dielectric region 121 is filled with an oxide (e.g., silicon dioxide), or alternative insulating material, such that the second dielectric region is substantially planar with the upper surface of the epitaxial layer 104.

Forming the gate 116 in the second dielectric region 121 essentially results in the formation of a reduced surface field (RESURF) structure. RESURF is a well-known technique employed in the design of high voltage, low on-resistance devices. Basically, the RESURF effect distributes electric field potential lines in the device, primarily under a field oxide portion of the device, in a lateral direction towards the drain region 108. This results in a more optimal spreading of the potential lines at breakdown compared to a device which does not utilize RESURF, thereby increasing a breakdown voltage of the device. A higher impurity doping concentration (e.g., about $10^{17}$ atoms per cubic centimeter) can thus be used in a region of the epitaxial layer 104 proximate the P-body region 112, thereby reducing the on-resistance of the device without sacrificing breakdown voltage.

A channel region 128 is formed in the P-body region 112, proximate the gate 116, primarily from electrons that are gathered by the action of a positive potential applied to the gate. An insulating layer, preferably an oxide, formed between the gate 116 and the sidewall(s) and/or bottom wall of the second dielectric region 121, serves to provide electrical isolation between the gate and the source and P-body regions 110, 112. This insulating layer may be referred to herein as a gate oxide layer. The P-body region 112 may further include an enhancement region 114 comprised of a material having a P-type conductivity. The enhancement region 114 is preferably formed proximate the upper surface of the epitaxial layer 104 and is disposed between the source region 110 and the trench sinker 122 for providing a low resistance (e.g., less than about 10 ohms per square) electrical connection between the source region 110 and the trench sinker 122.

In accordance with an aspect of the present invention, the exemplary DMOS device 100 includes a dummy gate field plate 118, at least partially disposed in the first dielectric region 120 formed in the DMOS device. It is to be understood that the dummy gate field plate 118 is one example of what is more generally referred to herein as a shielding structure. The first dielectric region 120 is not limited to the particular shape and/or configuration shown in the figure. For example, first dielectric region 120 may comprise a trench having v-shaped sidewalls, often referred to as a v-groove. The first dielectric region 120, which may comprise an oxide (e.g., silicon dioxide) or other suitable insulating material (e.g., silicon nitride, etc.), is preferably formed between the drain region 108 and the second dielectric region 121. Although not shown, the dummy gate field plate 118 in the exemplary DMOS device 100 is preferably electrically connected (i.e., strapped) to the source region 110, such as by forming a conductive layer (e.g., aluminum, etc.) between the dummy gate field plate and the source region.

The dummy gate field plate 118 is disposed substantially vertically in the first dielectric region 120, the dummy gate field plate preferably being formed on at least a portion of a sidewall and/or bottom of the first dielectric region, nearest the source region 110. The first dielectric region 120 is then filled with an oxide (e.g., silicon dioxide), or alternative insulating material, such that the first dielectric region is substantially planar with the upper surface of the epitaxial layer 104. Dummy gate field plate 118 is formed of an electrically conductive material, such as, for example, polysilicon material, although suitable alternative materials (e.g., metal, etc.) may be similarly employed. Depending on whether the dummy gate field plate 118 is formed on the sidewall or the bottom of the first dielectric region 120, a maximum width of the dummy gate field plate will be determined by a depth or a width, respectively, of the first dielectric region, as will be understood by those skilled in the art. The dummy gate field plate 118 is preferably spaced apart from the gate 116 and preferably substantially non-overlapping relative to the gate.

The dummy gate field plate 118, like the gate 116, when configured in accordance with the techniques of the present invention, advantageously forms a RESURF structure which further beneficially distributes the field potential lines in the DMOS device 100, thereby further increasing a breakdown voltage of the device. This enables the doping concentration of the P-body region 112 under the source region 110 to be increased, thereby reducing the on-resistance of the device without sacrificing breakdown voltage. A localized doping region (not shown) may also be formed in the DMOS device 100, primarily beneath the second dielectric region 121 and extending downward from the bottom wall of the second dielectric region to about a depth of the dummy gate field plate 118. The localized doping region, which may be formed using an implant and diffusion process, may have a doping level that is significantly higher than the surrounding epitaxial layer 104, thus further reducing the on-resistance of the DMOS device. The doping level of the localized doping region need not be uniform but, in fact, can be graded such that the doping level within the localized doping region increases as a function of a distance measured from the dummy gate field plate 118 and extending substantially laterally toward the gate 116.

Due at least in part to the novel configuration of the dummy gate field plate 118, the dummy gate field plate protects the gate 116 by electrically isolating the source region 110 from high voltage created in an off state of the DMOS device 100. Moreover, the dummy gate field plate 118 reduces a gate-to-drain capacitance of the DMOS device, thus beneficially improving a high-frequency performance of the device. By controlling a shape and/or location of the dummy gate field plate 118 in the DMOS device 100, desired regions in the device can be beneficially protected against high electric field concentrations which may otherwise result in device breakdown. The present invention contemplates various alternative arrangements for the dummy gate field plate, as will be described below in conjunction with FIGS. 2–5.

In a preferred embodiment of the invention, the dummy gate field plate 118 can be formed concurrently with the gate 116 in the same processing step. A thickness of the insulating material (e.g., silicon dioxide) beneath the gate 116 and dummy gate field plate 118, often referred to as gate oxide, may be substantially the same, although it is contemplated that the thicknesses of the gate oxide under the gate and dummy gate field plate may be different as well. In a preferred embodiment of the invention, the thickness of the gate oxide under the gate 116 is about 200 angstroms to about 500 angstroms, and the gate oxide thickness under the dummy gate field plate 118 is about 200 angstroms to about 4000 angstroms. Furthermore, the size and shape of the dummy gate field plate 118 relative to the gate 116 may be substantially the same. It is to be appreciated, however, that the gate 116 and dummy gate field plate 118 are not limited to the precise size and/or shape shown, but may be formed in virtually any configuration, as will be understood by those skilled in the art.

Although not shown, drain and gate contacts may be formed on an upper surface of the exemplary DMOS device 100 for providing electrical connection to the drain region 108 and gate 116, respectively. The drain contact is formed above at least a portion of the drain region 108 and the gate contact may be formed above the gate 116, or at a different location on the upper surface of the device, as will be understood by those skilled in the art. Similarly, electrical connection to the source region 110 may be made through a source contact formed on the upper surface of the device. Alternatively, connection to the source region 110 is preferably made through a bottom surface of the substrate 102, since the trench sinker 122 provides a relatively low-resistance electrical path between the source region 110 and the substrate 102, as previously explained.

Figure 2:
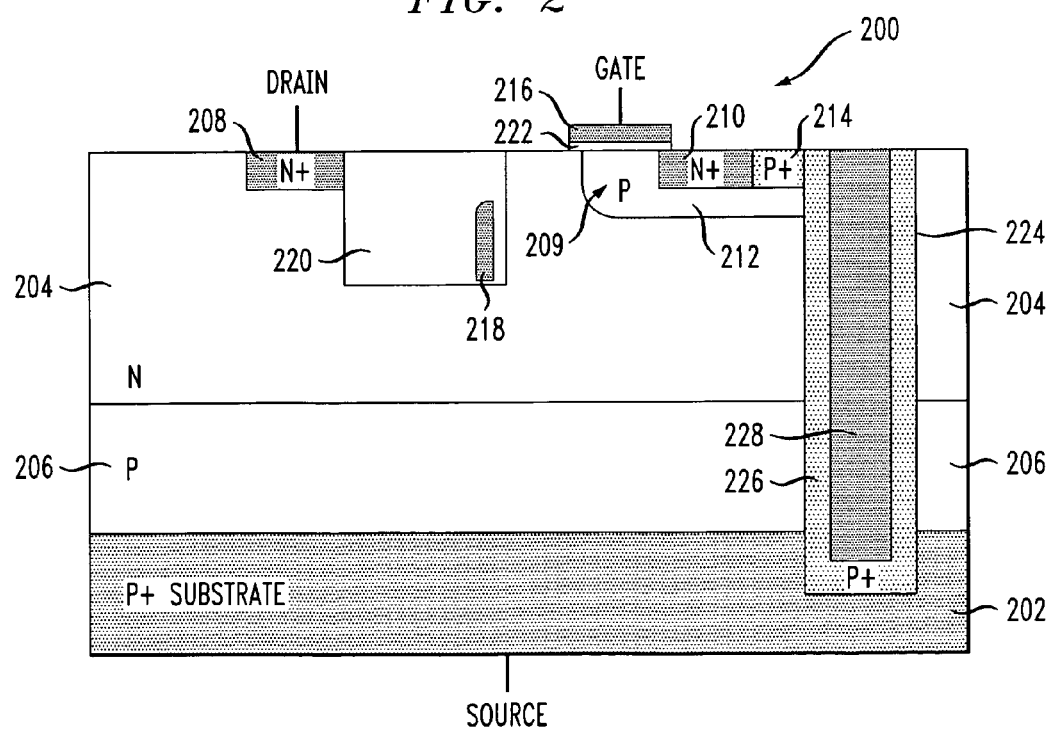
FIG. 2 is a cross-sectional view depicting at least a portion of an exemplary DMOS device, formed in accordance with a second embodiment of the present invention.

FIG. 2 depicts a cross-sectional view of an exemplary DMOS device 200, formed in accordance with a second embodiment of the invention. The exemplary DMOS device 200 is similar to the DMOS device 100 illustrated in FIG. 1, except that a single dielectric region 220 is formed in the device, and the DMOS device 200 includes a gate 216 formed laterally on an upper surface of the device, as will be described in further detail below.

Like the exemplary DMOS device 100 depicted in FIG. 1, DMOS device 200 preferably comprises a substrate 202 of a first conductivity type, preferably P-type, and an epitaxial layer 204 of a second conductivity type opposite the first conductivity type, preferably N-type, formed on the substrate. Optionally, a lightly doped P-layer 206 may be formed between the substrate 202 and the epitaxial layer 204 for balancing a charge of the epitaxial layer, as previously explained. The exemplary DMOS device 200 further includes a source region 210 and a drain region 208 formed in the epitaxial layer 204, such as by an implant or diffusion process. The source and drain regions are preferably doped with an impurity (e.g., boron, phosphorus, etc.) of a known concentration level to selectively change the conductivity of the material as desired. Preferably, the source and drain regions 210, 208 have a conductivity type associated therewith which is opposite a conductivity type of the substrate 202. In a preferred embodiment of the invention, the source and drain regions 210, 208 are of N-type conductivity.

One or more trench sinkers 224 are preferably formed through the epitaxial layer 204 and P-layer 206, and at least partially through the substrate 202. Trench sinker 224, which may be formed in a conventional manner, provides a low-resistance electrical connection (e.g., less than about one ohm per square) between the source region 210 and the substrate 202. On at least one or more sidewalls and/or a bottom wall of the trench sinker 224, an electrically conductive material 226 (e.g., doped polysilicon, metal, etc.) is formed. In a preferred embodiment of the invention, the conductive material 226 is of P-type conductivity. A center portion 228 of the trench sinker 224 also preferably comprises a conductive material (e.g., doped polysilicon, metal, etc.), although a nonconductive material (e.g., silicon dioxide) may also be used.

The source region 210 in exemplary DMOS device 200 is formed in a body region 212 that is formed in the epitaxial layer 204, such as by a conventional implant and diffusion process. The body region 212 is preferably disposed proximate an upper surface of the epitaxial layer 204 adjacent to the source region 210 and extends laterally in a direction opposite the drain region 208. The body region 212 is preferably doped, such as by a conventional implant step, with an impurity of a known concentration level to selectively change the conductivity of the material as desired. Preferably, the body region 212 has a conductivity type associated therewith which is opposite a conductivity type of the source region 210. In a preferred embodiment of the invention, the body region 212 is of P-type conductivity, and may therefore be referred to as a P-body region. The P-body region 212 may also include an enhancement region 214, preferably of P-type conductivity, formed proximate the upper surface of the epitaxial layer 204 between the source region 210 and the trench sinker 224. The enhancement region 214 provides a low-resistance electrical connection between the source region 210 and the trench sinker 224.

A channel region 209 is formed in the P-body region 212, proximate an upper surface of the exemplary DMOS device 200, just beneath an interface between the epitaxial layer 204, which is typically formed of silicon, and an insulating layer 222, which in a preferred embodiment is formed of an oxide (e.g., silicon dioxide ($SiO_2$), etc.). This interface may thus be referred to as a silicon/oxide interface. The channel region 209 is formed at least partially below and adjacent to the source region 210. Channel region 209 may be formed of a material having the same conductivity type as the substrate, preferably P-type in the exemplary device, and may be comprised of at least a portion of the P-body region 212. The gate 216 in the DMOS device 200 is formed above at least a portion of the channel region 209 and proximate the silicon/oxide interface of the device. The gate 216 may be formed of, for example, polysilicon material, although alternative suitable materials (e.g., metal) may be similarly employed. The insulating layer 222 formed under the gate 216 is often referred to as gate oxide, as will be understood by those skilled in the art.

Unlike the gate 116 in the exemplary DMOS device 100 illustrated in FIG. 1 which was formed in a substantially vertical arrangement in a dielectric trench, the gate 216 of the exemplary DMOS device 200 is formed above the channel region 209 on the upper surface of the device in a substantially horizontal arrangement. Accordingly, the gate 216 is not configured as a RESURF structure in DMOS device 200. Although not shown, the gate 216 may instead be configured such that at least a portion of the gate is formed laterally, above the channel region 209, and at least a portion of the gate is formed substantially vertically, in a dielectric region formed in the epitaxial layer 204 of the device 200, thereby combining the benefits of a lateral and vertical gate structure.

A dummy gate field plate 218 is preferably formed in the DMOS device 200, such as, for example, in a manner consistent with the dummy gate field plate arrangement of the DMOS device 100 of FIG. 1. As previously stated, the dummy gate field plate 218 is illustrative of what is more generally referred to herein as a shielding structure. The dummy gate field plate 218 in the exemplary DMOS device 200 is formed substantially vertically in dielectric region 220. The dielectric region 220 is formed proximate the upper surface of the epitaxial layer 204 and between the drain region 208 and P-body region 212. The dummy gate field plate 218 is preferably formed on at least a portion of a sidewall and/or bottom of the dielectric region 220, nearest the source region 210. Dummy gate field plate 218 is formed of an electrically conductive material, such as, for example, polysilicon, although suitable alternative materials (e.g., metal, etc.) may be similarly employed.

The dummy gate field plate 218, when configured in accordance with the techniques of the present invention, advantageously forms a RESURF structure which further beneficially distributes electric field potential lines in the DMOS device 200, thereby increasing a breakdown voltage of the device. This enables the doping concentration of the P-body region 212 under the source region 210 to be increased, thus reducing the on-resistance of the device without sacrificing breakdown voltage. Due at least in part to the novel configuration of the dummy gate field plate 218, the dummy gate field plate protects the gate 216 by electrically isolating the source region 210 from high voltage created in an off state of the DMOS device 200. Moreover, the dummy gate field plate 218 reduces a capacitance of the DMOS device, thus beneficially improving a high-frequency performance of the device. By controlling a shape and/or location of the dummy gate field plate 218 in the DMOS device 200, desired regions in the device can be beneficially protected against high electric field concentrations which may otherwise result in device breakdown.

Although not shown, at least a portion of the dummy gate field plate 218 may be formed laterally, such as on an insulating layer, which may be an extension of insulating layer 222, formed on the upper surface of the DMOS device 200, the dummy gate field plate 218 extending toward the gate 216 and being spaced apart from the gate. Moreover, at least a portion of dummy gate field plate 218 may be disposed laterally in the dielectric region 220, such as, for example, on a bottom wall of the dielectric region. In this manner, electric field potential lines in the DMOS device 200 may be advantageously distributed as desired to provide an increased breakdown voltage and improve reliability of the device.

Figure 3:
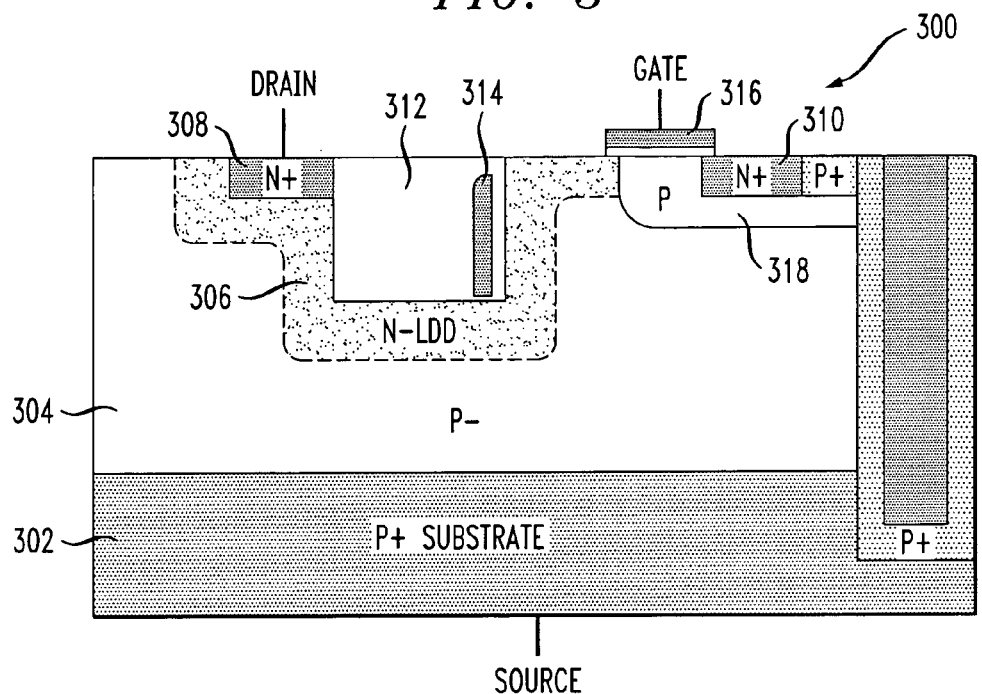
FIG. 3 is a cross-sectional view depicting at least a portion of an exemplary DMOS device, formed in accordance with a third embodiment of the present invention.

FIG. 3 is a cross-sectional view illustrating an exemplary DMOS device 300, formed in accordance with a third embodiment of the invention. DMOS device 300 is essentially identical to DMOS device 200 shown in FIG. 2, except that the N-type epitaxial layer has been replaced with a P-type epitaxial layer 304 formed on a P-type substrate 302. Drain and source regions 308 and 310, respectively, of N-type conductivity are formed in the epitaxial layer 304 proximate an upper surface of the epitaxial layer, such as, for example, by using an implant and diffusion process, as will be understood by those skilled in the art. A dielectric region 312 is formed in the epitaxial layer 304 proximate the upper surface of the epitaxial layer and between the drain and source regions 308, 310. A dummy gate field plate 314 is disposed in the dielectric region 312 in a substantially vertical manner, consistent with the arrangement of the dummy gate field plate 218 depicted in FIG. 2.

The exemplary DMOS device 300 includes a gate 316 formed substantially laterally on the upper surface of the epitaxial layer 304, the gate being disposed between the drain and source regions 308, 310. The gate 316 is formed, at least in part, above a body region 318, preferably of P-type conductivity. The P-body region 318 is preferably formed in the epitaxial layer 304 proximate the upper surface of the epitaxial layer, between the dielectric region 312 and at least partially under the source region 318. A localized lightly doped drain (LDD) region 306 is formed in the epitaxial layer 304, preferably of N-type conductivity, such as by an implant and diffusion process. The LDD region 306 extends substantially laterally in the epitaxial layer 304, for example, from the drain region 308 to the source region 310, the LDD region surrounding at least a portion of the drain region 308 and the dielectric region 312, and ending at the P-body region 318 proximate the upper surface of the epitaxial layer 304.

Figure 4:
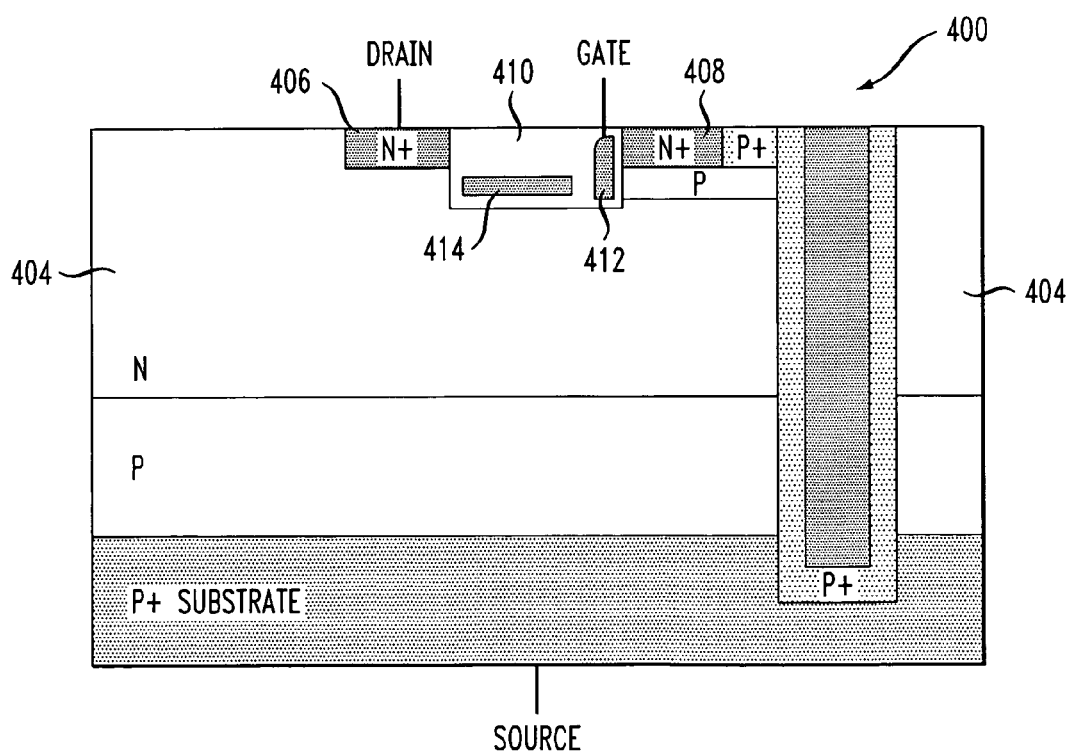
FIG. 4 is a cross-sectional view depicting at least a portion of an exemplary DMOS device, formed in accordance with a fourth embodiment of the present invention.

FIG. 4 is a cross-sectional view depicting an exemplary DMOS device 400, formed in accordance with a fourth embodiment of the invention. Exemplary DMOS device 400 is essentially the same as the DMOS devices previously described in conjunction with FIGS. 1–3, except for the arrangement of a gate 412 and dummy gate field plate 414 in the device. Specifically, DMOS device 400 preferably comprises a dielectric region 410 formed in an epitaxial region 404 of the device, proximate an upper surface of the epitaxial layer. Like the dielectric regions 120 and 121 in the DMOS device 100 of FIG. 1, dielectric region 410 preferably defines a trench extending downward from the upper surface of the epitaxial layer 404 to a desired distance through the epitaxial layer. Depending on the manner in which the dummy gate field plate 414 is disposed in the dielectric region 410, a depth or a width of the dielectric region in the epitaxial layer 404 will determine a maximum width of the dummy gate field plate 414. Drain and source regions 406 and 408, respectively, are formed in the epitaxial layer 404, proximate the upper surface of the epitaxial layer. The dielectric region 410 is formed between the drain and source regions 406, 408.

As apparent from the figure, the gate 412 and dummy gate field plate 414 in the exemplary DMOS device 400 are formed in the same dielectric region 410. The gate 412 is preferably formed substantially vertically in the dielectric region 410, such as, for example, on a sidewall of the dielectric region nearest the source region 408. The dummy gate field plate 414 is preferably formed substantially horizontally (e.g., parallel to a plane of the upper surface of the epitaxial layer 404) in the dielectric region 410, such as, for example, on a bottom wall of the dielectric region. The gate 412 is spaced apart from the dummy gate field plate 414 and is preferably non-overlapping relative to the dummy gate field plate.

Figure 5:
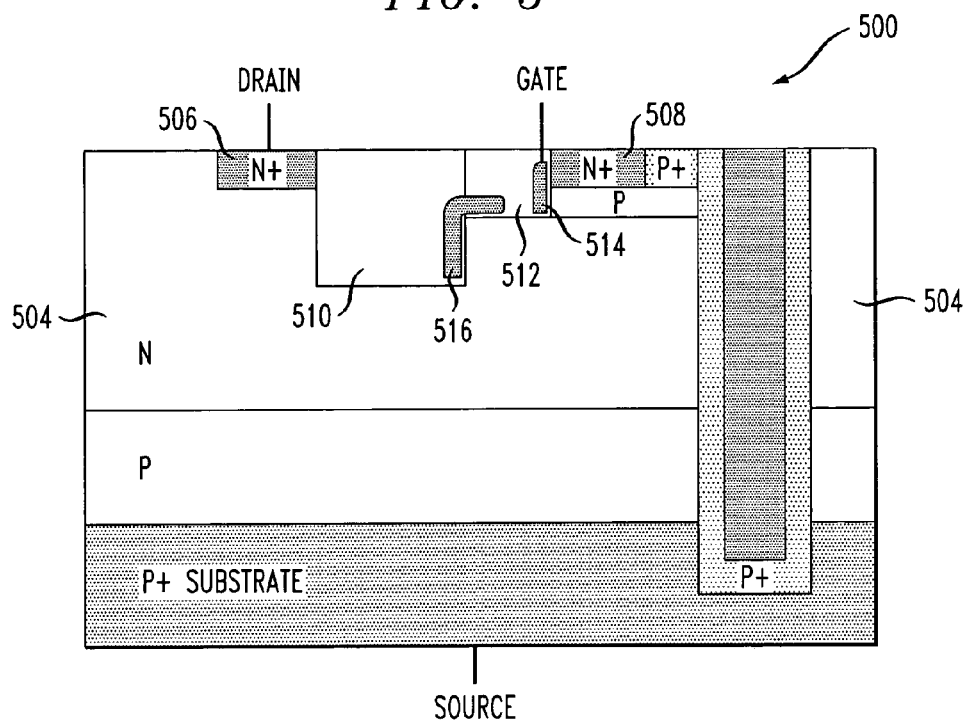
FIG. 5 is a cross-sectional view depicting at least a portion of an exemplary DMOS device, formed in accordance with a fifth embodiment of the present invention.

In a fifth embodiment of the invention, illustrated in FIG. 5, an exemplary DMOS device 500 comprises a first dielectric region 510 and a second dielectric region 512 formed in an epitaxial layer 504, proximate an upper surface of the epitaxial layer. Each of the first and second dielectric regions 510, 512, which may comprise an oxide (e.g., silicon dioxide), preferably defines a trench extending downward from the upper surface of the epitaxial layer 504 to a desired distance through the epitaxial layer. The first dielectric region 510 is formed to a first depth in the epitaxial layer 504 and the second dielectric region 512 is formed to a second depth in the epitaxial layer, the first depth being greater than the second depth.

The exemplary DMOS device 500 comprises a gate 514 formed substantially vertically in the second dielectric region 512, such as, for example, on a sidewall of the second dielectric region nearest the source region 508, and a dummy gate field plate 516. Although not shown, at least a portion of the gate 514 may extend laterally onto a bottom wall of the second dielectric region 512 and/or onto the upper surface of the epitaxial layer 504. The dummy gate field plate 516 is preferably formed such at least a portion of the dummy gate field plate is formed substantially vertically in the first dielectric region 510, such as, for example, on a sidewall of the first dielectric region nearest the second dielectric region 512, and at least a portion of the dummy gate field plate is formed substantially laterally in the second dielectric region, such as, for example, on the bottom wall of the second dielectric region. In this manner, the dummy gate field plate 516 overlaps a corner between the first and second dielectric regions 510, 512. Although not shown, at least a portion of the dummy gate field plate 516 may extend laterally onto a bottom wall of the first dielectric region 510. The gate 514 and dummy gate field plate 516 are spaced apart from one another. The first and second dielectric regions 510, 512 are then filled with an oxide (e.g., silicon dioxide), or alternative insulating material, such that the first and second dielectric regions are substantially planar with the upper surface of the epitaxial layer 504.

It is to be understood that the shapes of the first and second dielectric regions 510, 512 are not limited to the specific configurations shown. This holds true for any of the embodiments of the present invention described herein. For example, in an alternative embodiment (not shown), the first and second dielectric regions 510, 512 may be configured so as to provide a more smooth transition between the first and second depths, thereby eliminating or significantly reducing discontinuities in an electric field distribution in the exemplary DMOS device 500. The respective contours of the first and second dielectric regions 510, 512 and the shape and/or placement of the dummy gate field plate 516, as well as the gate 514, in the dielectric regions can be used to uniquely control a RESURF effect in the DMOS device 500 as desired, as previously explained, thereby improving a reliability and/or performance of the device.

FIGS. 6A through 6E depict steps in an illustrative methodology which may be used to form the exemplary DMOS device shown in FIG. 1, in accordance with one embodiment of the present invention. The illustrative methodology will be described in the context of a conventional CMOS compatible semiconductor fabrication process technology. It is to be understood that the invention is not limited to this or any particular methodology for fabricating the device. As previously stated, the various layers and/or regions shown in the figures may not be drawn to scale and certain semiconductor layers may have been omitted for ease of explanation.

Figure 6A:
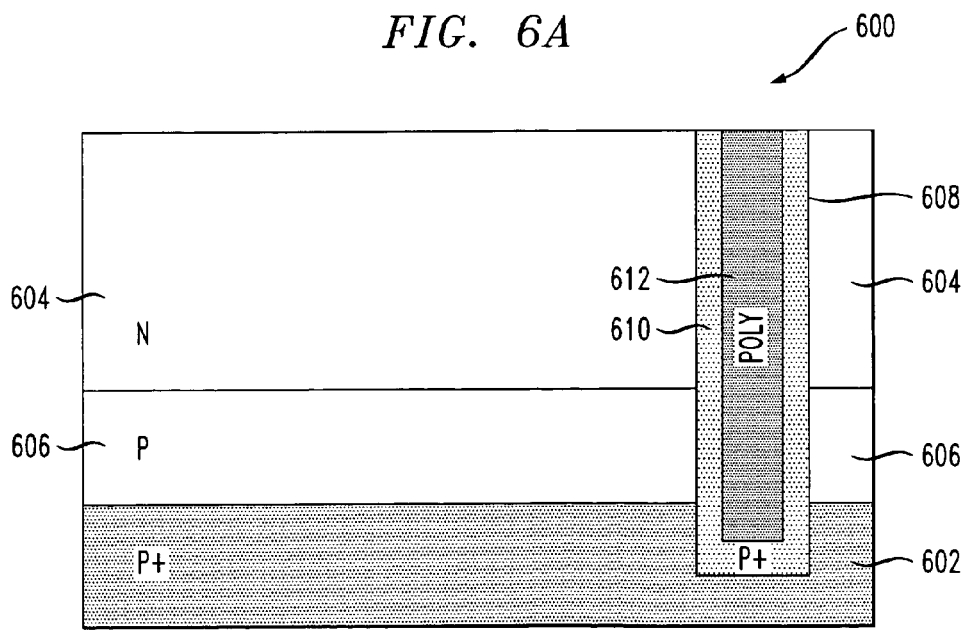
FIGS. 6A–6E are cross-sectional views depicting steps in an illustrative semiconductor fabrication process which may be used in forming the exemplary DMOS device shown in FIG. 1.

With reference to FIG. 6A, at least a portion of an exemplary semiconductor wafer 600 is shown in which the techniques of the present invention can be implemented. The wafer 600 preferably comprises a substrate 606 and a charge-balancing layer 606 formed on the substrate. The substrate 602 is preferably a P+ type substrate having a high conductivity, although an N+ type substrate may alternatively be employed. As will be understood by those skilled in the art, a P+ substrate may be formed by adding a P-type impurity or dopant (e.g., Boron) of a desired concentration (e.g., about $5 \times 10^{18}$ to about $5 \times 10^{19}$ atoms per cubic centimeter) to the substrate material, such as by a diffusion or implant step, to change the conductivity of the material as desired. Likewise, the charge-balancing layer 606 is preferably a P-type layer having a conductivity that is less than the conductivity of the substrate, such as, for example, about $10^{14}$ to about $3 \times 10^{15}$ atoms per cubic centimeter. A epitaxial layer 604 is then preferably grown over the entire surface of the wafer 600. The epitaxial layer 604 may also be modified by adding a P-type impurity. A breakdown voltage of the resulting transistor structure is determined, at least in part, by the thickness and impurity concentration of the epitaxial layer 604.

The wafer 600 further includes a trench sinker 608 for providing a low-resistance electrical connection between the substrate 602 and an upper surface of the epitaxial layer 604. The trench sinker 608 may be formed, for example, by creating an opening in the upper surface of the wafer 600 defining the trench sinker. The opening may be formed by depositing a layer of photoresist (not shown) on the upper surface of the wafer 600 and using a conventional photolithographic patterning step followed by an etching step to remove unwanted portions of the wafer. The opening is preferably formed (e.g., using reactive ion etching (RIE), dry etching, etc.) through the epitaxial layer 604 and P-layer 606, to expose the substrate 602. A conductive material 610 is then deposited on sidewalls and a bottom wall of the trench 608 using, for example, a deposition process. The conductive material 610 is preferably doped using an implant step. During the implant step, a P-type impurity (e.g., boron) of a predetermined concentration level is preferably used. A second conductive material 612, such as, for example, doped polysilicon, metal (e.g., aluminum), etc., is then deposited in the trench opening so as to substantially fill the opening. The conductive material in the opening forms a conductive via through the epitaxial layer 604 and P-layer 606, and provides a substantially low-resistance electrical path between the substrate 602 and the upper surface of the wafer 600.

Figure 6B:
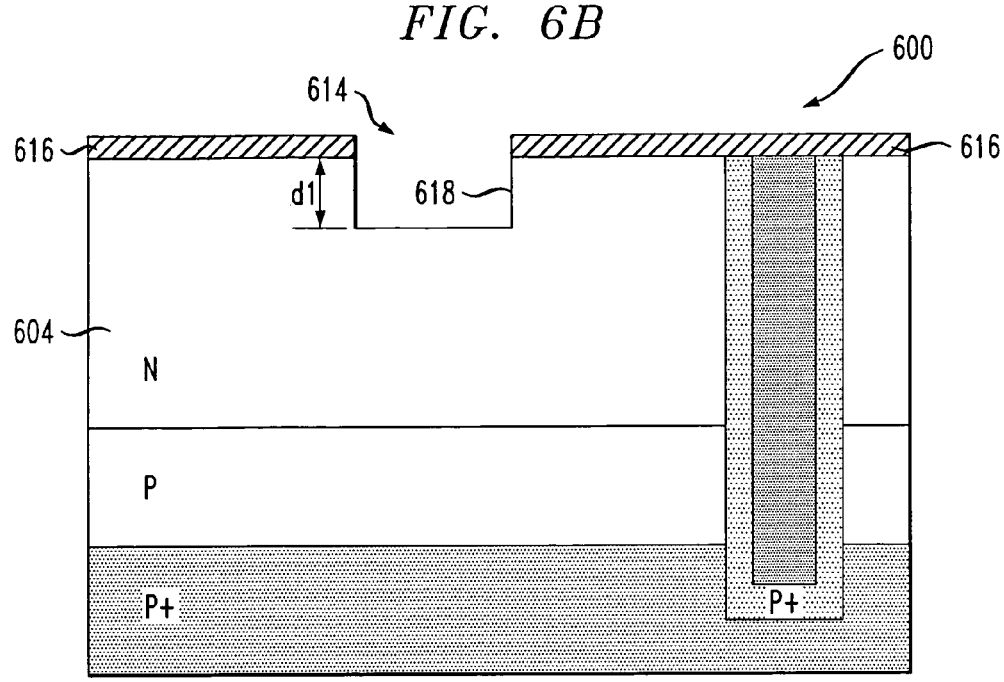

FIG. 6B illustrates the formation of a trench 618 in the epitaxial layer 604 of the wafer 600. Trench 618 will eventually be used to form the first dielectric region 120 of the exemplary DMOS device 100 shown in FIG. 1. The trench 618 may be formed by first depositing a layer of photoresist 616 on the upper surface of the wafer 600 and using a conventional photolithographic patterning and etching step to define an opening 614 in the photoresist layer. The photoresist layer 616 functions as a mask to protect desired portions of the wafer 600 during subsequent etching of the wafer. An etching step (e.g., using RIE, dry etching, wet etching, etc.) is then used to remove unwanted portions of the wafer not protected by the photoresist layer 616. The trench 618 is preferably formed to a distance d1 through the epitaxial layer 604.

Figure 6C:
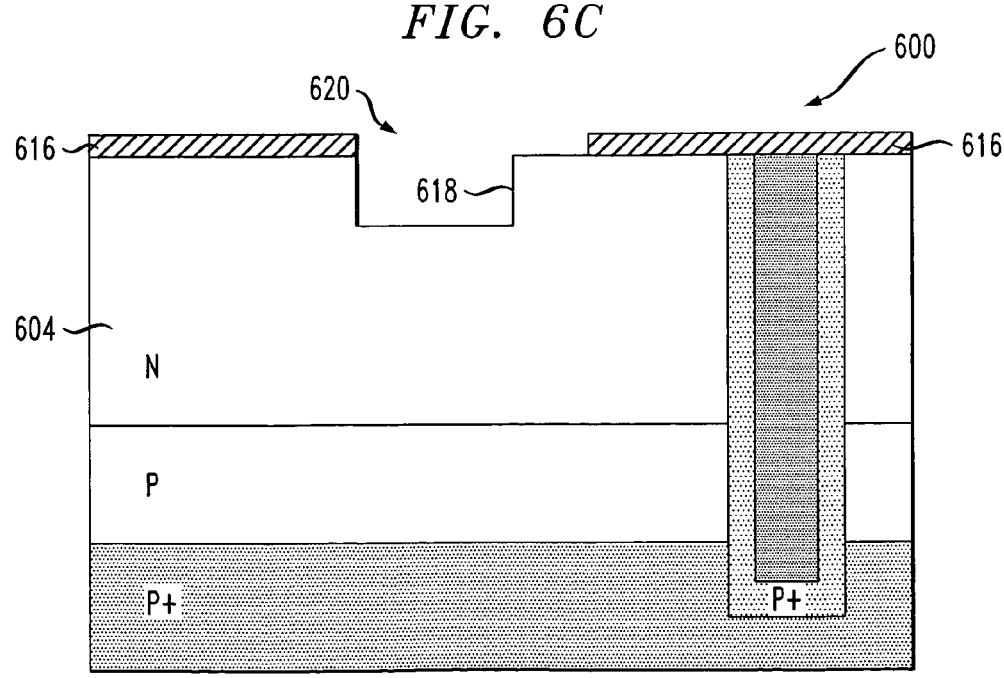
Figure 6D:
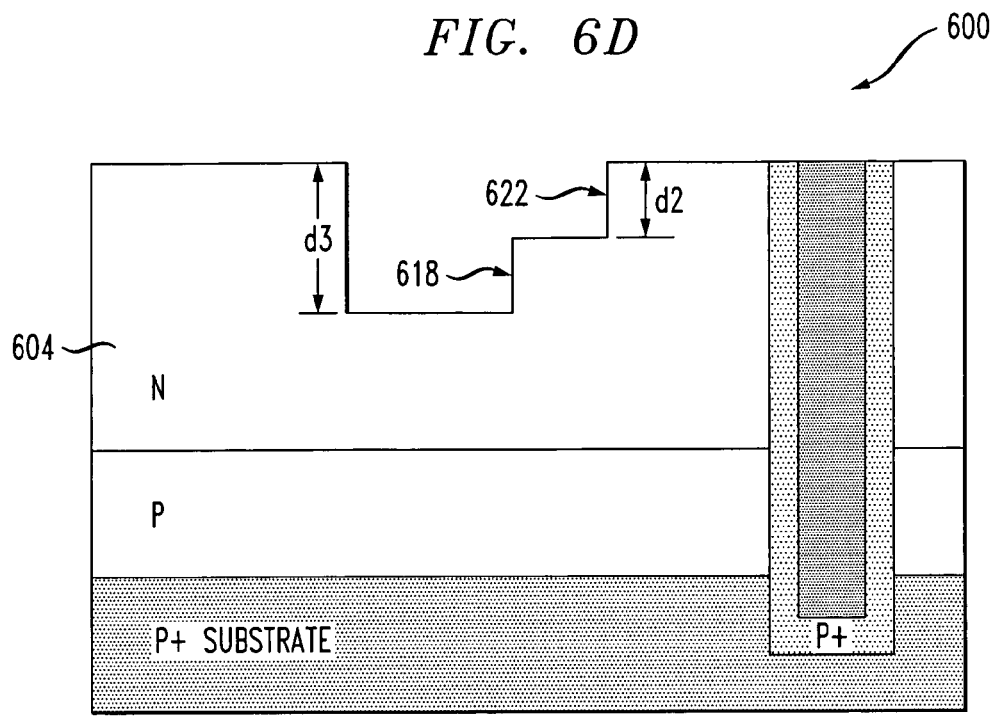

With reference to FIGS. 6C and 6D, after forming trench 618 in the epitaxial layer 604, photoresist layer 616 is deposited on the upper surface of the wafer 600 having an opening 620 therein, which may be formed by a conventional patterning and etching process, that is wider than the opening 614 used to define the trench 618. An etching step (e.g., RIE, dry etching, wet etching, etc.) is then used to remove portions of the wafer 600 not protected by the photoresist layer 616. The first trench 618 will be etched deeper into the epitaxial layer 604 and a second trench 622 will be formed in the epitaxial layer. The second trench 622 is preferably formed to a distance d2 through the epitaxial layer 604, which is substantially equal to a vertical depth of the gate 116 of exemplary DMOS device 100 shown in FIG. 1. Trench 618 will be formed a distance d3 through the epitaxial layer 604, which is substantially equal to a vertical depth of the dummy gate field plate 118 of DMOS device 100, the distance d3 being equal to a sum of the distances d1 and d2.

Figure 6E:
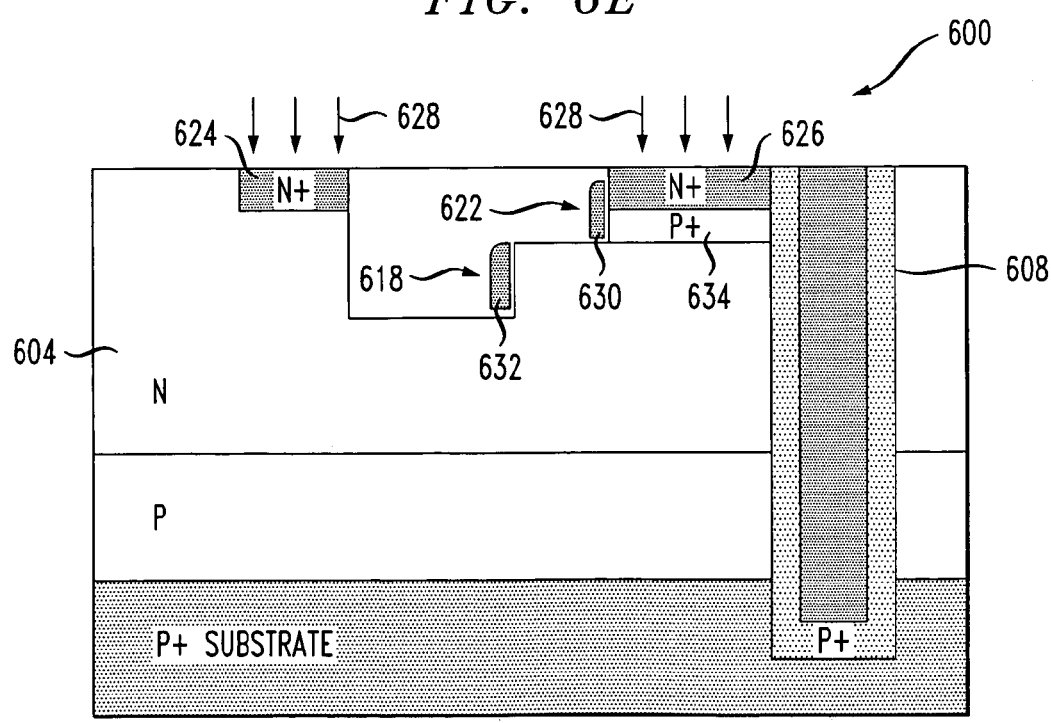

As depicted in FIG. 6E, a body region 634 is preferably formed in the epitaxial layer 604 of wafer 600, such as by implanting a P-type impurity (e.g., boron) into the epitaxial layer, followed by a diffusion step. A source region 626 is then formed in at least a portion of the body region 634 proximate the upper surface of the wafer 600, between the second trench 622. The source region 626 may be formed by diffusing or implanting an N-type impurity 628 (e.g., phosphorous or arsenic) of a know concentration level into the body region 634. Similarly, a drain region 624 is formed in the epitaxial layer 604 proximate the upper surface of the wafer 600 and adjacent to the trench 618. The drain region 624 may be formed by diffusing or implanting an N-type impurity 628 of a know concentration level into the epitaxial layer 604.

A layer of oxide (e.g., silicon dioxide), or an alternative insulating material (e.g., silicon nitride) is preferably grown on sidewalls and bottom walls of trenches 618 and 622. This oxide layer will electrically isolate a gate 630 and dummy gate field plate 632, formed on sidewalls of trenches 622 and 618, respectively, from active region of the resulting DMOS device. The gate 630 and dummy gate field plate 632 are preferably formed, for example, by depositing polysilicon on at least the sidewalls of the trenches 622, 618 nearest the source region 626, followed by an etching step to define the gate and dummy gate field plate as desired.

The DMOS device of the present invention may be implemented in an integrated circuit. In forming integrated circuits, a plurality of identical dies are typically fabricated in a repeated pattern on a surface of a semiconductor wafer. Each die includes a device described herein, and may include other structures or circuits. The individual dies are cut or diced from the wafer, then packaged as an integrated circuit. One skilled in the art would know how to dice wafers and package dies to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide-semiconductor (MOS) device, comprising:
a semiconductor layer formed on a substrate, the substrate defining a horizontal plane and a vertical direction normal to the horizontal plane;
first and second source/drain regions formed in the semiconductor layer proximate an upper surface of the semiconductor layer, the first and second source/drain regions being spaced apart relative to one another;
a gate formed proximate the upper surface of the semiconductor layer and disposed at least partially between the first and second source/drain regions;
a first dielectric region defining a trench extending downward from the upper surface of the semiconductor layer to a first distance into the semiconductor layer, the first dielectric region being formed between the first and second source/drain regions; and
a shielding structure formed substantially in the first dielectric region, at least a portion of the shielding structure being disposed adjacent at least one of a bottom wall of the first dielectric region and at least one sidewall of the first dielectric region;
wherein at least a portion of the gate is formed on a sidewall of the first dielectric region proximate the second source/drain region and at least a portion of the shielding structure is formed on the bottom wall of the first dielectric region, the shielding structure being spaced apart from the gate.

2. The device of claim 1, wherein the shielding structure is formed substantially vertically in the first dielectric region.

3. The device of claim 1, wherein the shielding structure is formed substantially horizontally in the first dielectric region.

4. The device of claim 1, wherein the gate is formed above the upper surface of the semiconductor layer and extending substantially laterally between the first dielectric region and the second source/drain region.

5. The device of claim 1, further comprising an insulating layer formed on at least a portion of the upper surface of the semiconductor layer, wherein the gate is formed on the insulating layer at least partially between the shielding structure and the second source/drain region.

6. The device of claim 1, wherein the first source/drain region comprises a drain region and the second source/drain region composes a source region.

7. The device of claim 1, wherein the shielding structure is electrically connected to the second source/drain region.

8. The device of claim 1, wherein a first insulating layer under the gate and a second insulating layer under the shielding structure are formed of different thicknesses relative to one another.

9. The device of claim 1, wherein the semiconductor layer comprises an epitaxial layer.

10. The device of claim 1, wherein the shielding structure and the gate comprise an electrically conductive material.

11. A metal-oxide-semiconductor (MOS) device, comprising:
a semiconductor layer formed on a substrate, the substrate defining a horizontal plane and a vertical direction normal to the horizontal plane;
first and second source/drain regions formed in the semiconductor layer proximate an upper surface of the semiconductor layer, the first and second source/drain regions being spaced apart relative to one another;
a gate formed proximate the upper surface of the semiconductor layer and disposed at least partially between the first and second source/drain regions;
a first dielectric region defining a trench extending downward from the upper surface of the semiconductor layer to a first distance into the semiconductor layer, the first dielectric region being formed between the first and second source/drain regions; and a shielding structure formed substantially in the first dielectric region, at least a portion of the shielding structure being disposed adjacent at least one of a bottom wall of the first dielectric region and at least one sidewall of the first dielectric region;

wherein at least a portion of the gate is disposed substantially vertically in the first dielectric region and at least a portion of the gate is formed above the upper surface of the semiconductor layer and extending substantially laterally toward the second source/drain region.

12. A metal-oxide-semiconductor (MOS) device, comprising:

a semiconductor layer formed on a substrate, the substrate defining a horizontal plane and a vertical direction normal to the horizontal plane;

first and second source/drain regions formed in the semiconductor layer proximate an upper surface of the semiconductor layer, the first and second source/drain regions being spaced apart relative to one another;

a gate formed proximate the upper surface of the semiconductor layer and disposed at least partially between the first and second source/drain regions;

a first dielectric region defining a trench extending downward from the upper surface of the semiconductor layer to a first distance into the semiconductor layer, the first dielectric region being formed between the first and second source/drain regions; and a shielding structure formed substantially in the first dielectric region, at least a portion of the shielding structure being disposed adjacent at least one of a bottom wall of the first dielectric region and at least one sidewall of the first dielectric region;

wherein at least a portion of the shielding structure is disposed substantially vertically in the first dielectric region and at least a portion of the shielding structure is formed above the upper surface of the semiconductor layer and extending substantially laterally toward the second source/drain region.

13. A metal-oxide-semiconductor (MOS) device, comprising:

a semiconductor layer formed on a substrate, the substrate defining a horizontal plane and a vertical direction normal to the horizontal plane;

first and second source/drain regions formed in the semiconductor layer proximate an upper surface of the semiconductor layer, the first and second source/drain regions being spaced apart relative to one another;

a gate formed proximate the upper surface of the semiconductor layer and disposed at least partially between the first and second source/drain regions;

a first dielectric region defining a trench extending downward from the upper surface of the semiconductor layer to a first distance into the semiconductor layer, the first dielectric region being formed between the first and second source/drain regions;

a shielding structure formed substantially in the first dielectric region, at least a portion of the shielding structure being disposed adjacent at least one of a bottom wall of the first dielectric region and at least one sidewall of the first dielectric region; and a substrate contact formed proximate the second source/drain region and extending downward through the semiconductor layer and at least partially through the substrate, the substrate contact providing an electrical connection between the second source/drain region and the substrate.

14. The device of claim 13, wherein the substrate contact comprises:

a trench extending downward through the semiconductor layer and at least partially through the substrate; and a conductive material disposed on at least a bottom and one or more sidewalls of the trench.

15. A metal-oxide-semiconductor (MOS) device, comprising:

a semiconductor layer formed on a substrate, the substrate defining a horizontal plane and a vertical direction normal to the horizontal plane;

first and second source/drain regions formed in the semiconductor layer proximate an upper surface of the semiconductor layer, the first and second source/drain regions being spaced apart relative to one another;

a gate formed proximate the upper surface of the semiconductor layer and disposed at least partially between the first and second source/drain regions;

a first dielectric region defining a trench extending downward from the upper surface of the semiconductor layer to a first distance into the semiconductor layer, the first dielectric region being formed between the first and second source/drain regions;

a shielding structure formed substantially in the first dielectric region, at least a portion of the shielding structure being disposed adjacent at least one of a bottom wall of the first dielectric region and at least one sidewall of the first dielectric region; and a second semiconductor layer of the second conductivity type disposed between the semiconductor layer and the substrate, the semiconductor layer having a first doping concentration associated therewith and the second semiconductor layer having a second doping concentration associated therewith, the first doping concentration being substantially equal to the second doping concentration so as to substantially balance a charge between the semiconductor layer and the second semiconductor layer.

16. A metal-oxide-semiconductor (MOS) device, comprising:

a semiconductor layer formed on a substrate, the substrate defining a horizontal plane and a vertical direction normal to the horizontal plane;

first and second source/drain regions formed in the semiconductor layer proximate an upper surface of the semiconductor layer, the first and second source/drain regions being spaced apart relative to one another;

a gate formed proximate the upper surface of the semiconductor layer and disposed at least partially between the first and second source/drain regions;

a first dielectric region defining a trench extending downward from the upper surface of the semiconductor layer to a first distance into the semiconductor layer, the first dielectric region being formed between the first and second source/drain regions;

a shielding structure formed substantially in the first dielectric region, at least a portion of the shielding structure being disposed adjacent at least one of a bottom wall of the first dielectric region and at least one sidewall of the first dielectric region; and a second dielectric region defining a trench extending downward from the upper surface of the semiconductor layer to a second distance through the semiconductor layer, as measured from the upper surface of the semiconductor layer, the second dielectric region being formed proximate the first dielectric region between the first dielectric region and the second source/drain region, the second distance being less than the first distance, wherein the gate is disposed substantially vertically in the second dielectric region, at least a portion of the gate being formed on a sidewall of the second dielectric region.

17. The device of claim 16, wherein the shielding structure is non-overlapping relative to the gate.

18. A metal-oxide-semiconductor (MOS) device, comprising:
   a semiconductor layer formed on a substrate, the substrate defining a horizontal plane and a vertical direction normal to the horizontal plane;
   first and second source/drain regions formed in the semiconductor layer proximate an upper surface of the semiconductor layer, the first and second source/drain regions being spaced apart relative to one another;
   a gate formed proximate the upper surface of the semiconductor layer and disposed at least partially between the first and second source/drain regions;
   a first dielectric region defining a trench extending downward from the upper surface of the semiconductor layer to a first distance into the semiconductor layer, the first dielectric region being formed between the first and second source/drain regions;
   a shielding structure formed substantially in the first dielectric region, at least a portion of the shielding structure being disposed adjacent at least one of a bottom wall of the first dielectric region and at least one sidewall of the first dielectric region; and
   a localized doping region formed in the semiconductor layer proximate the shielding structure and under at least a portion of the gate, the localized doping region surrounding at least a portion of the first source/drain region and the first dielectric region, the localized doping region having a doping level which is higher compared to a doping level of the semiconductor layer.

19. A metal-oxide-semiconductor (MOS) device, comprising:
   a semiconductor layer formed on a substrate, the substrate defining a horizontal plane and a vertical direction normal to the horizontal plane;
   first and second source/drain regions formed in the semiconductor layer proximate an upper surface of the semiconductor layer, the first and second source/drain regions being spaced apart relative to one another;
   a gate formed proximate the upper surface of the semiconductor layer and disposed at least partially between the first and second source/drain regions;
   a first dielectric region defining a trench extending downward from the upper surface of the semiconductor layer to a first distance into the semiconductor layer, the first dielectric region being formed between the first and second source/drain regions;
   a shielding structure formed substantially in the first dielectric region, at least a portion of the shielding structure being disposed adjacent at least one of a bottom wall of the first dielectric region and at least one sidewall of the first dielectric region; and
   a localized doping region formed in the semiconductor layer proximate the shielding structure and under at least a portion of the gate, the localized doping region having a doping level which is higher compared to a doping level of the semiconductor layer;
   wherein the doping level within the localized doping region increases as a function of a distance measured from the shielding structure and extending substantially laterally toward the gate.

20. An integrated circuit including at least one metal-oxide-semiconductor (MOS) device, the at least one MOS device comprising:
   a semiconductor layer formed on a substrate, the substrate defining a horizontal plane and a vertical direction normal to the horizontal plane;
   first and second source/drain regions formed in the semiconductor layer proximate an upper surface of the semiconductor layer, the first and second source/drain regions being spaced apart relative to one another;
   a gate formed proximate the upper surface of the semiconductor layer and disposed at least partially between the first and second source/drain regions;
   a first dielectric region defining a trench extending downward from the upper surface of the semiconductor layer to a first distance into the semiconductor layer, the first dielectric region being formed between the first and second source/drain regions; and
   a shielding structure formed substantially in the first dielectric region, at least a portion of the shielding structure being disposed adjacent at least one of a bottom wall of the first dielectric region and at least one sidewall of the first dielectric region;
   wherein at least a portion of the gate is formed on a sidewall of the first dielectric region proximate the second source/drain region and at least a portion of the shielding structure is formed on the bottom wall of the first dielectric region, the shielding structure being spaced apart from the gate.

21. A method of forming a metal-oxide-semiconductor device, the method comprising the steps of:
   forming a semiconductor layer on a substrate, the substrate defining a horizontal plane and a vertical direction normal to the horizontal plane;
   forming first and second source/drain regions in the semiconductor layer proximate an upper surface of the semiconductor layer, the first and second source/drain regions being spaced apart relative to one another;
   forming a gate proximate the upper surface of the semiconductor layer and disposed at least partially between the first and second source/drain regions;
   forming a first dielectric region defining a trench extending downward from the upper surface of the semiconductor layer to a first distance into the semiconductor layer, the first dielectric region being formed between the first and second source/drain regions; and
   forming a shielding structure substantially in the first dielectric region, at least a portion of the shielding structure being disposed adjacent at least one of a bottom wall of the first dielectric region and at least one sidewall of the first dielectric region;
   wherein at least a portion of the gate is formed on a sidewall of the first dielectric region proximate the second source/drain region and at least a portion of the shielding structure is formed on the bottom wall of the first dielectric region, the shielding structure being spaced apart from the gate.

* * * * *